US012396345B2

(12) United States Patent
Wang et al.

(10) Patent No.: US 12,396,345 B2
(45) Date of Patent: Aug. 19, 2025

(54) TRANSPARENT DISPLAY PANEL, METHOD FOR MANUFACTURING THE SAME, AND TRANSPARENT DISPLAY DEVICE

(71) Applicant: Kateeva Display Technology (Shaoxing) Limited, Shaoxing (CN)

(72) Inventors: Erdong Wang, Shaoxing (CN); Jianglong Chen, Shaoxing (CN)

(73) Assignee: Kateeva Display Technology (Shaoxing) Limited, Shaoxing (CN)

( * ) Notice: Subject to any disclaimer, the term of this patent is extended or adjusted under 35 U.S.C. 154(b) by 481 days.

(21) Appl. No.: 17/875,415

(22) Filed: Jul. 28, 2022

(65) Prior Publication Data

US 2023/0037241 A1 Feb. 2, 2023

(30) Foreign Application Priority Data

Jul. 30, 2021 (CN) .......................... 202110872334.8

(51) Int. Cl.
*H10K 59/32* (2023.01)
*H01L 23/00* (2006.01)
(Continued)

(52) U.S. Cl.
CPC ............. *H10K 59/32* (2023.02); *H01L 24/26* (2013.01); *H01L 24/29* (2013.01); *H01L 24/32* (2013.01);
(Continued)

(58) Field of Classification Search
CPC .... H10K 59/32; H10K 59/121; H10K 59/128; H10K 59/18; H10K 59/353;
(Continued)

(56) References Cited

U.S. PATENT DOCUMENTS 10,510,813 B2 * 12/2019 Son ................. G02F 1/133502
12,161,037 B2 * 12/2024 Liu ....................... H10K 59/121
(Continued)

FOREIGN PATENT DOCUMENTS

CN 102569345 A * 7/2012
CN 204496464 U 7/2015
(Continued)

OTHER PUBLICATIONS

Chinese Office Action issued Apr. 7, 2022, in corresponding Chinese Patent Application No. 202110872334.8.

*Primary Examiner* — Michelle Mandala
(74) *Attorney, Agent, or Firm* — Westbridge IP LLC

(57) ABSTRACT

A transparent display panel, a method for manufacturing the same, and a transparent display device are provided. the transparent display panel includes a first display substrate including: a first substrate and first pixel units thereon; and a second display substrate including: a second substrate and second pixel units thereon, the second pixel units are in one-to-one correspondence with the first pixel units, each first pixel unit includes a first display unit and a first transparent unit, and each second pixel unit includes a second display unit and a second transparent unit, an orthographic projection of the first display unit on the second substrate substantially coincides with that of the corresponding second display unit on the second substrate, and an orthographic projection of the first transparent unit on the second substrate substantially coincides with that of the corresponding second transparent unit on the second substrate.

13 Claims, 5 Drawing Sheets

(51) Int. Cl.
*H01L 25/065* (2023.01)
*H10K 59/121* (2023.01)
*H10K 59/128* (2023.01)
*H10K 59/18* (2023.01)
*H10K 59/35* (2023.01)
*G09G 3/20* (2006.01)
*H10K 59/122* (2023.01)
*H10K 102/00* (2023.01)

(52) U.S. Cl.
CPC .......... *H01L 24/83* (2013.01); *H01L 25/0657* (2013.01); *H10K 59/121* (2023.02); *H10K 59/128* (2023.02); *H10K 59/18* (2023.02); *H10K 59/353* (2023.02); *G09G 3/20* (2013.01); *H01L 24/27* (2013.01); *H01L 2224/26125* (2013.01); *H01L 2224/27418* (2013.01); *H01L 2224/2919* (2013.01); *H01L 2224/32145* (2013.01); *H01L 2224/83862* (2013.01); *H01L 2224/83874* (2013.01); *H10K 59/122* (2023.02); *H10K 2102/3031* (2023.02)

(58) Field of Classification Search
CPC .......... H10K 59/122; H10K 2102/3031; H01L 24/26; H01L 24/29; H01L 24/32; H01L 24/83; H01L 25/0657; H01L 24/27; H01L 2224/26125; H01L 2224/27418; H01L 2224/2919; H01L 2224/32145; H01L 2224/83862; H01L 2224/83874; G09G 3/20

See application file for complete search history.

(56) References Cited

U.S. PATENT DOCUMENTS

| | | | |
|---|---|---|---|
| 2014/0184669 A1* | 7/2014 | Oh | G09G 3/007 345/82 |
| 2021/0005589 A1* | 1/2021 | Kim | H01L 33/62 |
| 2022/0043525 A1* | 2/2022 | Lin | H10K 59/65 |
| 2022/0285653 A1* | 9/2022 | Tian | H10K 59/8791 |
| 2022/0352285 A1* | 11/2022 | Shi | H10K 50/87 |
| 2023/0217710 A1* | 7/2023 | Jinta | H10K 59/353 257/40 |
| 2023/0282623 A1* | 9/2023 | Huang | H10K 50/865 257/79 |
| 2024/0212597 A1* | 6/2024 | Wang | G09G 3/3233 |

FOREIGN PATENT DOCUMENTS

| | | |
|---|---|---|
| CN | 108254954 A | 7/2018 |
| CN | 108469700 A | 8/2018 |

* cited by examiner

TRANSPARENT DISPLAY PANEL, METHOD FOR MANUFACTURING THE SAME, AND TRANSPARENT DISPLAY DEVICE

CROSS-REFERENCE TO RELATED APPLICATION

This application claims priority from Chinese Application No. 202110872334.8, filed on Jul. 30, 2021, the contents of which are incorporated by reference herein in its entirety.

TECHNICAL FIELD

The present disclosure relates to a field of display technology, and in particular, to a transparent display panel, a method for manufacturing the same, and a transparent display device.

BACKGROUND

The so-called transparent display device means that the display device itself has light penetration to a certain extent, which enables the user to clearly see the background behind the display device while viewing the picture displayed on the display device. Therefore, transparent display devices are suitable for building windows, car windows and shop windows, and the like.

SUMMARY

Some embodiments of the present disclosure provide a transparent display panel, comprising:
a first display substrate comprising:
    a first substrate; and
    a plurality of first pixel units arranged on the first substrate; and
a second display substrate attached to the first display substrate, the second display substrate comprising:
    a second substrate; and
    a plurality of second pixel units arranged on the second substrate, the plurality of second pixel units being in one-to-one correspondence with the plurality of first pixel units,
wherein, each first pixel unit comprises a first display unit and a first transparent unit, and each second pixel unit comprises a second display unit and a second transparent unit,
for each first pixel unit, an orthographic projection of the first display unit of the first pixel unit on the second substrate substantially coincides with an orthographic projection of the second display unit of the second pixel unit corresponding to the first pixel unit on the second substrate, and an orthographic projection of the first transparent unit of the first pixel unit on the second substrate substantially coincides with an orthographic projection of the second transparent unit of the second pixel unit corresponding to the first pixel unit on the second substrate.

In some embodiments, the first display unit is located on a side of the first substrate facing the second display substrate, and the first display unit is configured to emit light toward the second substrate; the second display unit is located on a side of the second substrate facing the first display substrate, and the second display unit is configured to emit light toward the second substrate.

In some embodiments, the first display unit comprises a first sub-pixel and a second sub-pixel, the first sub-pixel is configured to emit light of a first color, and the second sub-pixel is configured to emit light of a second color,
the second display unit comprises a third sub-pixel, and the third sub-pixel is configured to emit light of a third color.

In some embodiments, each first pixel unit and its corresponding second pixel unit constitute a pixel unit, for each pixel unit,
    the first sub-pixel comprises a first light-emitting element and a first sub-pixel driving circuit, and the first sub-pixel driving circuit is disposed between the first substrate and the first light-emitting element;
    the second sub-pixel comprises a second light-emitting element and a second sub-pixel driving circuit, and the second sub-pixel driving circuit is disposed between the first substrate and the second light-emitting element;
    the third sub-pixel comprises a third light-emitting element and a third sub-pixel driving circuit, and the third sub-pixel driving circuit is disposed between the second substrate and the third light-emitting element,
    an orthographic projection of the first light-emitting element on the second substrate and an orthographic projection of the second light-emitting element on the second substrate both fall within an orthographic projection of the third light-emitting element on the second substrate.

In some embodiments, for each pixel unit, a pixel defining layer is disposed between the first light-emitting element and the second light-emitting element, at least a part of an orthographic projection of pixel defining layer on the second substrate overlaps with an orthographic projection of the third sub-pixel driver circuit on the second substrate.

In some embodiments, the transparent display panel further comprises:
    a plurality of spacers which are arranged between the first display substrate and the second display substrate, so that the first display substrate and the second display substrate are arranged in parallel and spaced apart by a predetermined distance.

In some embodiments, an orthographic projection of the at least one spacer on the second substrate at least partially overlaps with an orthographic projection of the pixel defining layer on the second substrate.

In some embodiments, for each first pixel unit, an area of the first display unit is substantially equal to an area of the first transparent unit.

In some embodiments, the first display substrate and the second display substrate are bonded together by optical clear resin, and the optical clear resin is arranged on at least one of the first display substrate and the second display substrate by inkjet printing.

In some embodiments, the first light-emitting element comprises a top-emitting electroluminescent device, the second light-emitting element comprises a top-emitting electroluminescent device, and the third light-emitting element comprises a bottom-emitting electroluminescent device.

In some embodiments, an area ratio of the first light-emitting element to the second light-emitting element ranges from 1:1 to 1.1:1.

In some embodiments, a ratio of the sum of areas of the first light-emitting element and the second light-emitting element to an area of the third light-emitting element ranges from 0.8:1 to 1:1.

Some embodiments of the present disclosure provide a transparent display device, comprising the transparent display panel according to the above embodiments.

Some embodiments of the present disclosure provide a method for manufacturing a transparent display panel, comprising:

providing a first display substrate, wherein the first display substrate comprises a first substrate and a plurality of first pixel units arranged on the first substrate, each of the first pixel units comprises a first display unit and a first transparent unit;

providing a second display substrate, wherein the second display substrate comprises a second substrate and a plurality of second pixel units arranged on the second substrate, the plurality of second pixel units are in one-to-one correspondence with the plurality of first pixel units, each second pixel unit comprises a second display unit and a second transparent unit;

bonding the first display substrate and the second display substrate, so that for each first pixel unit, an orthographic projection of the first display unit of the first pixel unit on the second substrate substantially coincides with an orthographic projection of the second display unit of the second pixel unit corresponding to the first pixel unit on the second substrate, and an orthographic projection of the first transparent unit of the first pixel unit on the second substrate substantially coincides with an orthographic projection of the second transparent unit of the second pixel unit corresponding to the first pixel unit on the second substrate.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure, and for those skilled in the art, other drawings can also be obtained from these drawings without creative efforts. In the drawings.

DETAILED DESCRIPTION OF EMBODIMENTS

Figure 1:
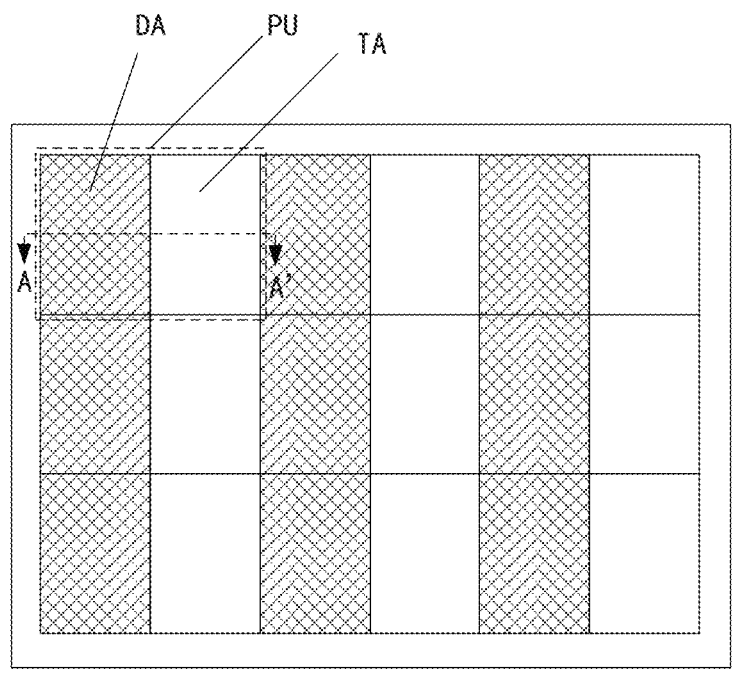
FIG. 1 is a schematic structural view of a transparent display panel provided by some embodiments of the present disclosure.

In order to more clearly illustrate the objectives, technical solutions and advantages of the present disclosure, the embodiments of the present disclosure will be described in detail below with reference to the accompanying drawings. Obviously, the described embodiments are only some, but not all, embodiments of the present disclosure. Based on the embodiments in the present disclosure, all other embodiments obtained by those skilled in the art without creative efforts shall fall within the protection scope of the present disclosure. It should be understood that the following description of the embodiments is intended to explain and illustrate the general concept of the present disclosure, and should not be construed to limit the present disclosure. In the specification and drawings, the same or similar reference numbers refer to the same or similar parts or components. For the purpose of clarity, the drawings are not necessarily to scale and some well-known components and structures may be omitted from the drawings.

Unless otherwise defined, technical or scientific terms used in the present disclosure shall have the ordinary meaning as understood by those skilled in the art to which this disclosure belongs. As used in the present disclosure, "first," "second," and similar terms do not denote any order, quantity, or importance, but are merely used to distinguish the various components. The word "a" or "an" does not exclude a plurality. "Comprise" or "comprising" and similar words mean that the elements or things appearing before the word encompass the elements or things recited after the word and their equivalents, but do not exclude other elements or things. Words like "connected" or "connecting" are not limited to physical or mechanical connections, but may comprise electrical connections, whether direct or indirect. "Up", "down", "left", "right", "top" or "bottom" are only used to indicate relative positional relationship. When the absolute position of the described object changes, the relative positional relationship may also change accordingly. When an element is referred to as being "on" or "under" another element, it can be directly "on" or "under" the other element, or intervening elements may be present.

In the related art, an electroluminescence display panel, such as an organic light-emitting diode display panel, is usually used to realize transparent display. For example, for each display unit of the electroluminescence display panel, such as a pixel, it comprises a display area and a transparent area. The display area comprises, for example, three sub-pixels of different colors, such as a red sub-pixel, a green sub-pixel and a blue sub-pixel, to realize color display. The red sub-pixel, the green sub-pixel and the blue sub-pixel are all implemented by, for example, organic light-emitting diodes. Three sub-pixels are distributed in the display area of one display unit, for example, arranged side by side. In order to ensure the transparency of the display panel, the area ratio of the display area to the transparent area needs to meet a preset range. If the area ratio is too small, the area of the transparent area is too large and the area of the display area is too small, the sub-pixel size in the display area may be too small, the luminous brightness of each sub-pixel is low, and the display effect of the display panel is poor. If the area ratio is too large, the transparent area may too small, and the display area may be too large, resulting in poor transparency of the display panel.

In addition, in order to improve the resolution of the entire display panel, a single display unit needs to be as small as possible. Due to the limitation of the process, the minimum size that each sub-pixel can achieve is limited, which leads to a limited minimum size of the display area. The smaller the size of the sub-pixel is, the lower the luminous brightness is.

For the above reasons, the transparent display panel in the related art may not satisfy the characteristics of high resolution, high brightness and high transparency at the same time.

The present disclosure provides a transparent display panel, comprising: a first display substrate comprising: a first substrate; and a plurality of first pixel units arranged on the first substrate; and a second display substrate attached to the first display substrate, the second display substrate comprising: a second substrate; and a plurality of second pixel units arranged on the second substrate, the plurality of second pixel units being in one-to-one correspondence with the plurality of first pixel units, wherein, each first pixel unit comprises a first display unit and a first transparent unit, and each second pixel unit comprises a second display unit and a second transparent unit, for each first pixel unit, an orthographic projection of the first display unit of the first pixel unit on the second substrate substantially coincides with an orthographic projection of the second display unit of the second pixel unit corresponding to the first pixel unit on the second substrate, and an orthographic projection of the first transparent unit of the first pixel unit on the second substrate substantially coincides with an orthographic projection of the second transparent unit of the second pixel unit corresponding to the first pixel unit on the second substrate.

The present disclosure uses stacked display substrates to change the arrangement of sub-pixels in the display area, and the sub-pixels in the display unit are stacked so that the area of each sub-pixel may be increased while the area of the display area is constant, thereby improving the luminous brightness of each sub-pixel, as a result, the transparent display panel has higher display brightness and the display effect is enhanced.

FIG. 1 is a schematic structural view of a transparent display panel provided by some embodiments of the present disclosure. As shown in FIG. 1, the transparent display panel 100 comprises a plurality of pixel units PU, and the plurality of pixel units PU are arranged according to a predetermined rule, such as an array arrangement. Each pixel unit PU comprises a display area DA and a transparent area TA, the display area TA is used for displaying, and the transparent area TA is used for allowing a user to see objects behind the transparent display panel 100 through the transparent display panel 100.

As shown in FIG. 1, in each pixel unit PU, the display area DA and the transparent area TA are arranged left and right, and the display area DA is located on the left side of the transparent area TA. However, the present disclosure is not limited to this. In some embodiments, the display area DA may also be located on the right side of the transparent area TA. In some embodiments, the display area DA and the transparent area TA may also be arranged up and down, for example, the display area DA is located on the upper side of the transparent area TA, or the display area DA is located on the lower side of the transparent area TA. In some embodiments, the arrangements of the display area DA and the transparent area TA may comprise one or more of the above arrangements. For example, in some pixel units PU, the display area DA is located on the left side of the transparent area TA; in some pixel unit PU, the display area DA is located on the right side of the transparent area TA; in some pixel units PU, the display area DA is located on the upper side of the transparent area TA; and in some pixel units PU, the display area DA is located on the lower side of the transparent area TA.

In the following embodiments, taking the case where the display area DA and the transparent area TA are arranged left and right, and the display area DA is located on the left side of the transparent area TA as an example for description.

Figure 2:
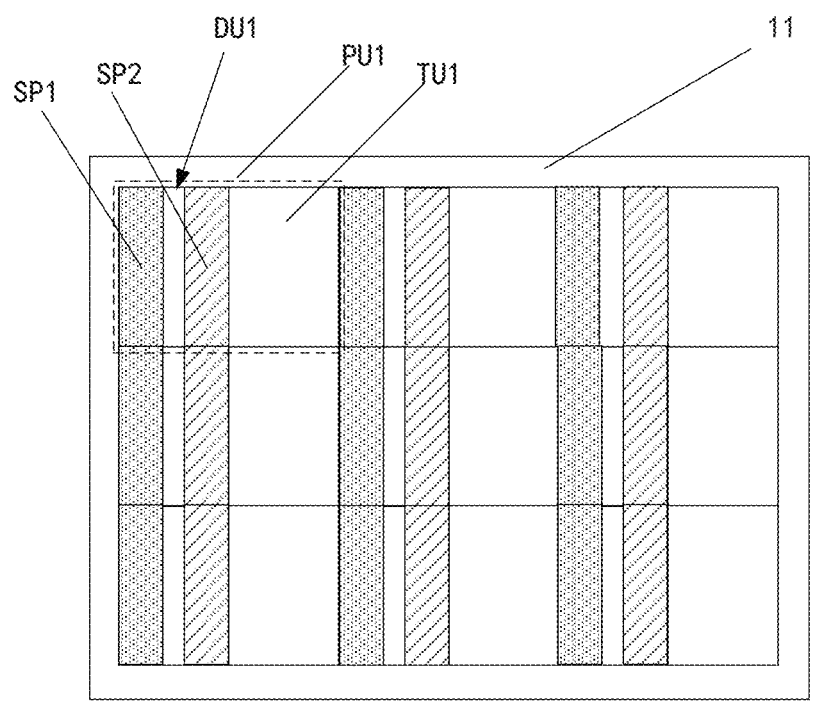
FIG. 2 is a schematic structural view of a first display substrate provided by some embodiments of the present disclosure.

FIG. 2 is a schematic structural view of a first display substrate provided by some embodiments of the present disclosure. As shown in FIG. 1 and FIG. 2, the transparent display panel 100 comprises a first display substrate 10. The first display substrate 10 comprises a first substrate 11 and a plurality of first pixel units PU1 arranged on the first substrate 11, each of the first pixel units PU1 comprises a first display unit DU1 and a first transparent unit TU1.

Figure 3:
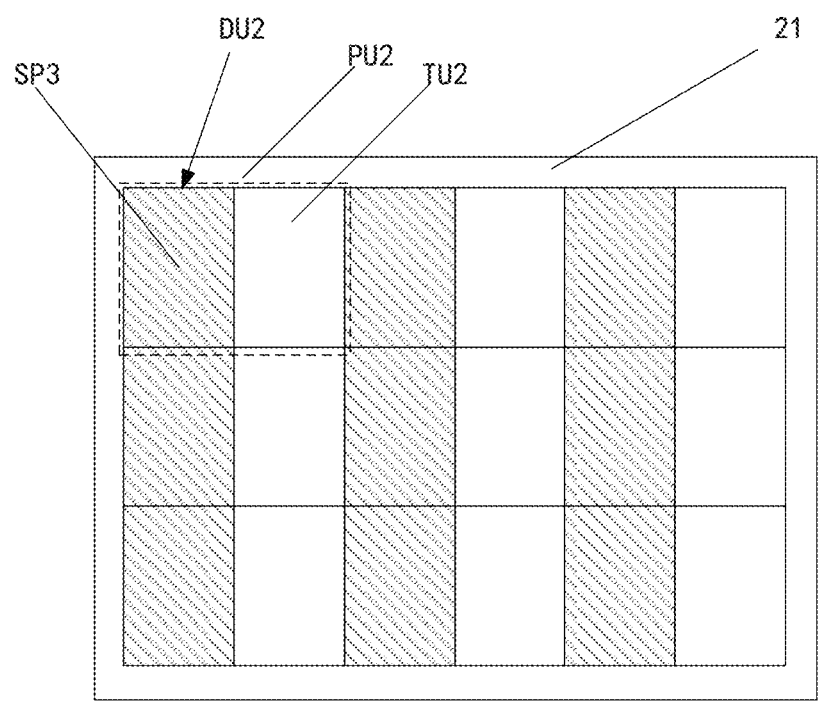
FIG. 3 is a schematic structural view of a second display substrate provided by some embodiments of the present disclosure.

FIG. 3 is a schematic structural view of a second display substrate provided by some embodiments of the present disclosure. As shown in FIG. 1 and FIG. 3, the transparent display panel 100 comprises a second display substrate 20. The second display substrate 20 comprises a second substrate 21 and a plurality of second pixel units PU2 arranged on the second substrate 21, and each second pixel unit PU2 comprises a second display unit DU2 and a second transparent unit TU2.

Figure 4:
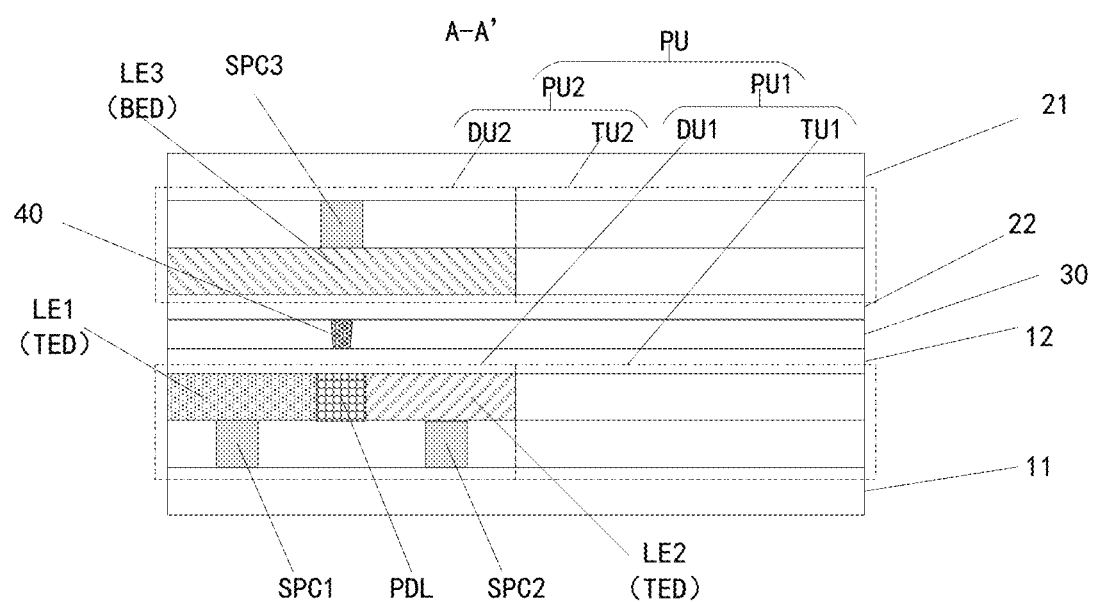
FIG. 4 is a schematic cross-sectional structural view of the transparent display panel in FIG. 1 along the line A-A'.

FIG. 4 is a schematic cross-sectional structural view of the transparent display panel in FIG. 1 along the line A-A', FIG. 4 only shows the cross-sectional structure of one pixel. As shown in FIG. 1-4, the first display substrate 10 shown in FIG. 2 and the second display substrate 20 shown in FIG. 3 are attached to each other to obtain the transparent display panel shown in FIG. 1. The plurality of first pixel units PU1 shown in FIG. 2 are in one-to-one correspondence with the plurality of second pixel units PU2 shown in FIG. 3. The first pixel unit PU1 and its corresponding second pixel unit PU2 constitute one pixel unit PU. For each pixel unit PU, an orthographic projection of the first display unit DU1 of the first pixel unit PU1 on the second substrate 21 substantially coincides with an orthographic projection of the second display unit DU2 of the second pixel unit PU2 corresponding to the first pixel unit PU1 on the second substrate 21, and an orthographic projection of the first transparent unit TU1 of the first pixel unit PU1 on the second substrate 21 substantially coincides with an orthographic projections of the second transparent unit TU2 of the second pixel unit PU2 corresponds to the first pixel unit PU1 on the second substrate 21. The first display unit DU1 of the first pixel unit PU1 and the second display unit DU2 of the second pixel unit PU2 corresponding to the first pixel unit PU1 constitute the display area DA of the pixel unit PU, and the first transparent unit TU1 of the first pixel unit PU and the second transparent unit TU2 of the second pixel unit PU2 corresponding to the first pixel unit PU1 constitute the transparent area TA.

As shown in FIGS. 1-4, the first display unit DU1 comprises a first sub-pixel SP1 and a second sub-pixel SP2. The first sub-pixel SP1 is, for example, a red sub-pixel configured to emit red light, and the second sub-pixel SP2 is, for example, a green sub-pixel configured to emit green light. The second display unit DU2 comprises a third sub-pixel SP3, and the third sub-pixel SP3 is, for example, a blue sub-pixel configured to emit blue light. The red sub-pixel, the green sub-pixel and the blue sub-pixel cooperate so that the transparent display panel 100 may realize color display.

As shown in FIGS. 1-4, the first sub-pixel SP1 and the second sub-pixel SP2 are arranged left and right, and an orthographic projection of any one of the first sub-pixel SP1 and the second sub-pixel SP2 on the second substrate 21 falls within an orthographic projection of the third sub-pixels SP3 on the second substrate 21. That is, the third sub-pixel SP3 is superimposed on the first sub-pixel SP1 and the second sub-pixel SP2. With this arrangement, the area of the display area TA occupied by the three sub-pixels may be reduced as much as possible, and the resolution of the transparent display panel may be improved. When the area of the display area TA is fixed, it is also possible to increase the area occupied by each sub-pixel, thereby improving the display brightness of the sub-pixel.

As shown in FIGS. 1-4, the first sub-pixel SP1, the second sub-pixel SP2 and the third sub-pixel SP3 are implemented by, for example, electroluminescent devices, such as organic light-emitting diodes. Specifically, the first sub-pixel SP1 comprises a first light-emitting element LE1, such as a red organic light-emitting diode, and a first sub-pixel driving circuit SPC1, and the first sub-pixel driving circuit SPC1 is disposed between the first substrate 11 and the first light-emitting element LE1. The first light-emitting element LE1 comprises, for example, a first anode layer, a first hole injection layer, a first hole transport layer, a first light-emitting layer, such as a red light-emitting layer, a first electron transport layer, a first electron injection layer and a first cathode layer disposed away from the first substrate 11 in sequence. The first light-emitting element LE1 is, for example, a top-emitting electroluminescent device TED, which may emit red light toward the second substrate 21 under the driving of the first sub-pixel driving circuit SPC1.

The second sub-pixel SP2 comprises a second light-emitting element LE2, such as a green organic light-emitting diode, and a second sub-pixel driving circuit SPC2 disposed on the first substrate 11. The second sub-pixel driving circuit SPC2 is disposed between the first substrate 11 and the light-emitting elements LE2. The second light-emitting element LE2 comprises, for example, a second anode layer, a second hole injection layer, a second hole transport layer, a second light-emitting layer such as a green light-emitting layer, a second electron transport layer, a second electron injection layer and a second cathode layer disposed away from the first substrate 11 in sequence. The second light-emitting element LE2 is, for example, a top-emitting electroluminescent device TED, which may emit green light toward the second substrate 21 under the driving of the second sub-pixel driving circuit SPC2.

The third sub-pixel SP3 comprises a third light-emitting element LE3, such as a blue organic light-emitting diode, and a third sub-pixel driving circuit SPC3. The third sub-pixel driving circuit SPC3 is disposed between the second substrate 21 and the third light-emitting elements LE3. The third light-emitting element LE3 comprises, for example, a third anode layer, a third hole injection layer, a third hole transport layer, and a third light-emitting layer such as a green light-emitting layer, a third electron transport layer, a third electron injection layer and the third cathode layer disposed away from the second substrate 21 in sequence. The third light-emitting element LE3 is, for example, a bottom-emitting electroluminescent device BED, which may emit blue light toward the second substrate 21 under the driving of the third sub-pixel driving circuit SPC3.

In some embodiments, as shown in FIGS. 1-4, an orthographic projection of the first light-emitting element EL1 on the second substrate 21 and an orthographic projection of the second light-emitting element LE2 on the second substrate 21 both fall within an orthographic projection of the third light-emitting element LE3 on the second substrate 21. The red light emitted by the first light-emitting element LE1 and the green light emitted by the second light-emitting element LE2 may penetrate the third light-emitting element LE3 and the second substrate 21 to exit, and maintain their colors. Thus, color display may be realized on the display side of the transparent display panel, i.e., the side of the second substrate 21 away from the first substrate 11.

In some embodiments, as shown in FIG. 4, for each first pixel unit PU1, the first light-emitting element LE1 and the second light-emitting element LE2 are arranged apart from each other, for example, a pixel defining layer PDL is arranged between the first light-emitting element LE1 and the second light-emitting element the LE2. The pixel defining layer PLD may be used as a divider between the first light-emitting element LE1 and the second light-emitting element LE2 to avoid crosstalk between the light emitted by the first light-emitting element LE1 and the light emitted by the second light-emitting element LE2. As shown in FIG. 4, in some embodiments, at least a part of an orthographic projection of the pixel defining layer PDL on the second substrate 21 overlaps with an orthographic projection of the third sub-pixel driving circuit SPC3 on the second substrate 21. For example, the orthographic projection of the pixel defining layer PDL on the second substrate 21 falls within the orthographic projection of the third sub-pixel driving circuit SPC3 on the second substrate 21.

Since the sub-pixel driving circuit is generally opaque, when the third light-emitting element LE3 emits blue light toward the second substrate 21 under the driving of the third sub-pixel driving circuit SPC3, part of the blue light may be blocked by the third sub-pixel driving circuit SPC3. The third sub-pixel driving circuit SPC3 may also block a part of the red light emitted by the first light-emitting element LE1 that penetrates the third light-emitting element LE3 and a part of the green light emitted by the second light-emitting element LE2 that penetrates the third light-emitting element LE3. Setting the third sub-pixel driving circuit SPC3 to overlap the pixel defining layer PDL between the first light-emitting element LE1 and the second light-emitting element LE2 as much as possible may reduce the blocking effect of the third sub-pixel driving circuit SPC3 on the red light emitted by the first light-emitting element LE1 and/or the green light emitted by the second light-emitting element LE2, which may ensure the light-emitting effect of the display area DA.

In some embodiments, the first transparent unit TU1 and the second transparent unit TU2 comprise, for example, a transparent filling material, such as a transparent resin material.

In some embodiments, the first display substrate 10 and the second display substrate 20 are bonded together using optical clear resin 30 (OCR, Optical Clear Resin). Compared with the optical clear adhesive (OCA) commonly used in the related art, the optical clear resin may have a smaller thickness, for example, 1-5 μm. Therefore, the gap between the first display substrate 10 and the second display substrate 20 after they are attached may be made as small as possible, so as to avoid crosstalk between adjacent pixels.

In addition, the first display substrate 10 and the second display substrate 20 may be bonded with the optical clear resin (OCR, Optical Clear Resin). First, an array of optical clear resin droplets is formed on at least one of the first display substrate 10 and the second display substrate 20 by means of inkjet printing, and then the first display substrate 10 and the second display substrate 20 are aligned and attached. Using the inkjet printing process may improve production efficiency and save material. The transparent optical adhesive (OCA) used in the related art is usually thick, generally more than 50 μm, and is usually coated by spin coating, which is not suitable for inkjet printing.

In some embodiments, in order to ensure the optical properties of the transparent display panel, it is necessary to ensure a uniform gap between the first display substrate 10 and the second display substrate 20 after bonding the first display substrate 10 and the second display substrate 20. Therefore, as shown in FIGS. 1-4, the transparent display panel 100 further comprises a plurality of spacers 40, the plurality of spacers 40 are arranged between the first display substrate 10 and the second display substrate 20, and configured such that the first display substrate 10 and the second display substrate 20 are arranged in parallel and spaced apart by a predetermined distance. The distance between the first display substrate 10 and the second display substrate 20 is, for example, 1-5 μm.

In some embodiments, as shown in FIGS. 1-4, the first display substrate 10 further comprises a first encapsulation layer 12 disposed on a side of the first light-emitting element LE1 and the second light-emitting element LE2 away from the first substrate 11. The encapsulation layer 12 substantially covers the entire surface of the first substrate 11, and is configured to protect various structures on the first substrate 11, such as the first light-emitting element LE1 and the first sub-pixel driving circuit SPC1 of the first sub-pixel SP1, and the second light-emitting element LE2 and the second sub-pixel driving circuit SPC2 of the sub-pixel SP2. A surface of the first encapsulation layer 12 away from the first substrate 11 is flat and disposed parallel to the first substrate 11.

The second display substrate 20 further comprises a second encapsulation layer 22 disposed on a side of the third light-emitting element LE3 away from the second substrate 21. The second encapsulation layer 22 substantially covers the entire surface of the second substrate 21 and is configured to protect various structures on the second substrate 21, such as the third light-emitting element LE3 and the third sub-pixel driving circuit SPC3 of the third sub-pixel SP3. A surface of the second encapsulation layer 22 away from the second substrate 21 is flat and disposed parallel to the second substrate 21. The second display substrate 20 further comprises a plurality of spacers 40 disposed on the surface of the second encapsulation layer 22 away from the second substrate 21, and only one spacer is shown in FIG. 4. The spacer 40 is, for example, a column spacer, and its cross-section is, for example, a trapezoid, and its cross-sectional width gradually decreases in a direction away from the second encapsulation layer 22. The height of the spacer 40 is, for example, 1 to 5 μm. In other embodiments, the spacer 40 may also be a cylindrical spacer or a spacer of other shapes. The spacer 40 is formed of, for example, a resin material, and may be formed by a patterning process or an inkjet printing method, which is not specifically limited herein.

When the optical clear resin 30 (OCR) is formed by inkjet printing to attach the first display substrate 10 and the second display substrate 20, an array of optical clear resin droplets is printed by inkjet printing on the first display substrate 10 without spacers 40, specifically on the surface of the encapsulation layer 12 away from the first substrate 11, and then the second display substrate 20 provided with the spacers 40 is aligned and attached to the first display substrate 10. During the process of bonding the first display substrate 10 and the second display substrate 20, the spacer 40 may make the air bubbles between the optical clear resin droplets to be discharged smoothly, so as to avoid the existence of air bubbles in the formed transparent display panel 100.

In some embodiments, spacers 40 may also be provided on the first encapsulation layer 12 of the first display substrate 10, in this case, the array of optical clear resin droplets may be printed by inkjet printing on the surface of the second encapsulation layer 22 of the second display substrate 20 away from the second substrate 21.

In some embodiments, the spacers 40 may be disposed on both the first encapsulation layer 12 of the first display substrate 10 and the first encapsulation layer 22 of the second display substrate 20, and the array of optical clear resin droplets may be formed on at least one of the first display substrate 10 and the second display substrate 20 by means of inkjet printing.

In some embodiments, as shown in FIGS. 1-4, an orthographic projection of at least one spacer 40 on the second substrate 21 at least partially overlaps with the orthographic projection of the pixel defining layer PDL on the second substrate 21. For example, the orthographic projection of the spacer 40 on the second substrate 21 falls within the orthographic projection of the pixel defining layer PDL on the second substrate 21. This arrangements may prevent the spacer 40 from blocking the light emitted by the first sub-pixel SP1 and/or the second sub-pixel SP2, thereby ensuring the display effect of the transparent display panel 100.

In some embodiments, as shown in FIGS. 1-4, in one pixel unit PU, the area ratio of the display area DA to the transparent area TA, for example, ranges from 0.8:1 to 1.2:1. In some embodiments, the areas of the display area DA and the transparent area TA may be substantially the same. Those skilled in the art may adjust the area ratio of the display area DA to the transparent area TA according to actual needs, so as to ensure that the transparent display panel has good transparency effect and good display effect at the same time.

In some embodiments, as shown in FIGS. 1-4, in one first pixel unit PU1, the area ratio of the first light-emitting element LE1 to the second light-emitting element LE2 ranges from 1:1 to 1.1:1, for example. Since human eyes are more sensitive to the green light emitted by the second light-emitting element LE2, the area of the first light-emitting element LE1 may be appropriately larger than that of the second light-emitting element LE2, thereby ensuring the display effect of the transparent display panel.

In some embodiments, as shown in FIGS. 1-4, in one pixel unit PU, the ratio of the sum of areas of the first light-emitting element LE1 and the second light-emitting element LE2 to the area of the third light-emitting element LE3 ranges from 0.8:1 to 1:1, for example. Those skilled in the art may make the area occupied by the pixel defining layer PDL between the first light emitting element LE1 and the second light emitting element LE2 as small as possible, so that areas of the first light emitting element LE1 and the second light emitting element LE2 are increased as much as possible to ensure the display quality.

Some embodiments of the present disclosure further comprise a transparent display device, comprising the transparent display panel 100 described in the foregoing embodiments and a circuit device for driving the transparent display panel 100.

Figure 5:
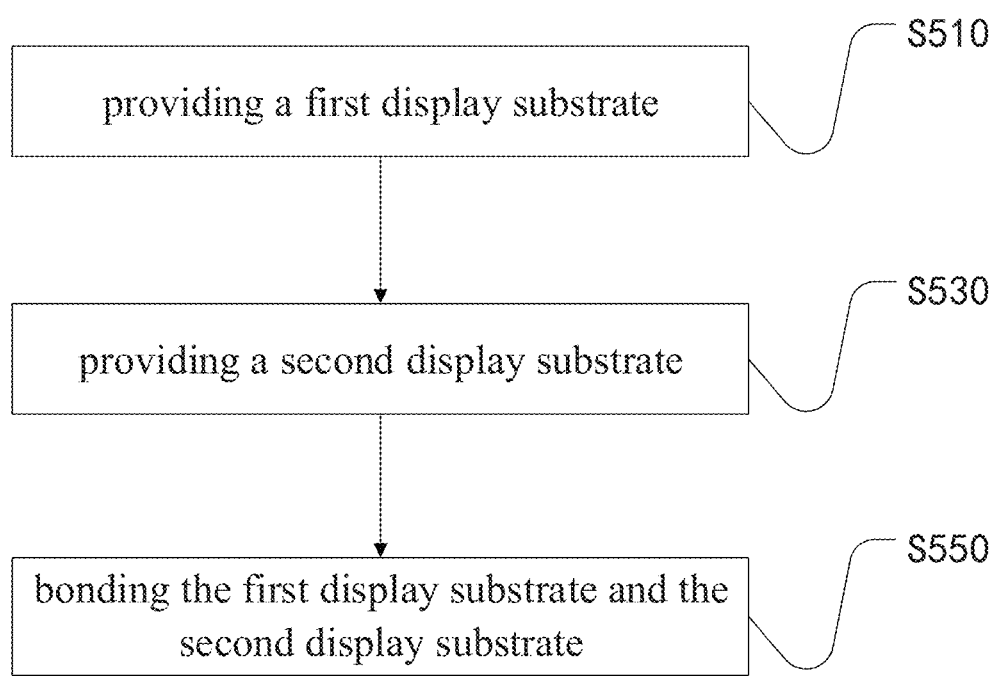
FIG. 5 is a flowchart of a method for manufacturing a transparent display panel provided by some embodiments of the present disclosure.

Some embodiments of the present disclosure provide a method for manufacturing a transparent display panel. The transparent display panel is, for example, the transparent display panel 100 described in the foregoing embodiments. FIG. 5 is a flowchart of a method for manufacturing a transparent display panel provided by some embodiments of the present disclosure.

The method comprises the following steps:

S510: providing a first display substrate;
S530: providing a second display substrate;
S550: bonding the first display substrate and the second display substrate.

In step S510, the first display substrate 10 comprises a first substrate 11 and a plurality of first pixel units PU1 arranged on the first substrate 11, and each first pixel unit PU1 comprises a first display unit DU1 and a first transparent Unit TU1. The plurality of first pixel units PU1 may be formed on the first substrate 11 by a patterning process.

In step S530, the second display substrate 20 comprises a second substrate 21 and a plurality of second pixel units PU2 arranged on the second substrate 21, and each second pixel unit PU2 comprises a second display unit DU2 and a second transparent Unit TU2. The plurality of second pixel units PU2 may be formed on the second substrate 21 by a patterning process.

In step S550, optical clear resin 30 (OCR) may be used to bond the first display substrate 10 and the second display substrate 20.

For example, an array of optical clear resin droplets is formed on at least one of the first display substrate 10 and the second display substrate 20 by means of inkjet printing, and then the first display substrate 10 and the second display substrate 20 are aligned and attached. The first pixel unit PU1 on the first display substrate 10 and the second pixel unit PU2 on the second display substrate 20 are aligned, and the first pixel unit PU1 and its corresponding second pixel unit PU2 constitute the pixel unit PU of the transparent display panel 100. For each pixel unit PU, an orthographic projection of the first display unit DU1 of the first pixel unit PU1 on the second substrate 21 substantially coincides with an orthographic projection of the second display unit DU2 of the second pixel unit PU2 corresponding to the first pixel unit PU1 on the second substrate 21, and an orthographic projection of the first transparent unit TU1 of the first pixel unit PU1 on the second substrate 21 substantially coincides with an orthographic projections of the second transparent unit TU2 of the second pixel unit PU2 corresponds to the first pixel unit PU1 on the second substrate 21.

In some embodiments, spacers 40 may be disposed on at least one of the first display substrate 10 and the second display substrate 20 to ensure an uniform gap between the first display substrate 10 and the second display substrate 20. During the process of aligning the first display substrate 10 and the second display substrate 20, the spacers 40 may make the air bubbles between the optical clear resin droplets to be discharged smoothly, so as to avoid the existence of air bubbles in the formed transparent display panel 100.

In some embodiments, the spacers 40 are disposed on one of the first display substrate 10 and the second display substrate 20, and the array of optical clear resin droplets are formed on the other one of the first display substrate 10 and the second display substrate 20 by inkjet printing, and then the first display substrate 10 and the second display substrate 20 are aligned and attached. In some embodiments, after the first display substrate 10 and the second display substrate 20 are aligned and attached, the optical clear resin between the first display substrate 10 and the second display substrate 20 may be cured, for example, by UV curing or heat curing manners.

Finally, it should be noted that each embodiment in this specification is described in a progressive manner, and each embodiment focuses on the differences from other embodiments, and the same and similar parts between the various embodiments may be referred to each other. For the system or device disclosed in the embodiments, since it corresponds to the method disclosed in the embodiment, the description is relatively simple, and reference may be made to the description in the method section for related parts.

The above embodiments are only used to illustrate the technical solutions of the present disclosure, but not to limit them. Although the present disclosure has been described in detail with reference to the foregoing embodiments, those skilled in the art should understand that: the recorded technical solutions are modified, or some technical features thereof are equivalently replaced; and these modifications or replacements do not make the essence of the corresponding technical solutions deviate from the spirit and scope of the technical solutions of the embodiments of the present disclosure.

What is claimed is:

1. A transparent display panel, comprising:
    a first display substrate comprising:
        a first substrate; and
        a plurality of first pixel units arranged on the first substrate; and
    a second display substrate attached to the first display substrate, the second display substrate comprising:
        a second substrate; and
        a plurality of second pixel units arranged on the second substrate, the plurality of second pixel units being in one-to-one correspondence with the plurality of first pixel units,
    wherein, the plurality of first pixel units first pixel unit and the plurality of second pixel units in one-to-one correspondence with the plurality of first pixel units constitute a plurality of pixel units,
    wherein, each first pixel unit comprises a first display unit and a first transparent unit, and each second pixel unit comprises a second display unit and a second transparent unit,
    for each pixel unit, an orthographic projection of the first display unit of the first pixel unit on the second substrate coincides with an orthographic projection of the second display unit of the second pixel unit corresponding to the first pixel unit on the second substrate, and an orthographic projection of the first transparent unit of the first pixel unit on the second substrate coincides with an orthographic projection of the second transparent unit of the second pixel unit correspondig to the first pixel unit on the second substrate,
    wherein the first display unit is located on a side of the first substrate facing the second display substrate, and the first display unit is configured to emit light toward the second substrate; the second display unit is located on a side of the second substrate facing the first display substrate, and the second display unit is configured to emit light toward the second substrate.

2. The transparent display panel according to claim 1, wherein the first display unit comprises a first sub-pixel and a second sub-pixel, the first sub-pixel is configured to emit light of a first color, and the second sub-pixel is configured to emit light of a second color, the second display unit comprises a third sub-pixel, and the third sub-pixel is configured to emit light of a third color.

3. The transparent display panel according to claim 2, wherein each first pixel unit and its corresponding second pixel unit constitute a pixel unit, for each pixel unit,
    the first sub-pixel comprises a first light-emitting element and a first sub-pixel driving circuit, and the first sub-pixel driving circuit is disposed between the first substrate and the first light-emitting element;
    the second sub-pixel comprises a second light-emitting element and a second sub-pixel driving circuit, and the second sub-pixel driving circuit is disposed between the first substrate and the second light-emitting element;
    the third sub-pixel comprises a third light-emitting element and a third sub-pixel driving circuit, and the third sub-pixel driving circuit is disposed between the second substrate and the third light-emitting element,
    an orthographic projection of the first light-emitting element on the second substrate and an orthographic projection of the second light-emitting element on the second substrate both fall within an orthographic projection of the third light-emitting element on the second substrate.

4. The transparent display panel according to claim 3, wherein, for each pixel unit, a pixel defining layer is disposed between the first light-emitting element and the second light-emitting element, at least a part of an orthographic projection of pixel defining layer on the second substrate overlaps with an orthographic projection of the third sub-pixel driver circuit on the second substrate.

5. The transparent display panel according to claim 3, wherein the transparent display panel further comprises:
a plurality of spacers which are arranged between the first display substrate and the second display substrate, so that the first display substrate and the second display substrate are arranged in parallel and spaced apart by a predetermined distance.

6. The transparent display panel according to claim 5, wherein an orthographic projection of the at least one spacer on the second substrate at least partially overlaps with an orthographic projection of the pixel defining layer on the second substrate.

7. The transparent display panel according to claim 1, wherein, for each first pixel unit, an area of the first display unit is equal to an area of the first transparent unit.

8. The transparent display panel according to claim 1, wherein the first display substrate and the second display substrate are bonded together by optical clear resin, and the optical clear resin is arranged on at least one of the first display substrate and the second display substrate by inkjet printing.

9. The transparent display panel according to claim 3, wherein the first light-emitting element comprises a top-emitting electroluminescent device, the second light-emitting element comprises a top-emitting electroluminescent device, and the third light-emitting element comprises a bottom-emitting electroluminescent device.

10. The transparent display panel according to claim 3, wherein an area ratio of the first light-emitting element to the second light-emitting element ranges from 1:1 to 1.1:1.

11. The transparent display panel according to claim 3, wherein a ratio of the sum of areas of the first light-emitting element and the second light-emitting element to an area of the third light-emitting element ranges from 0.8:1 to 1:1.

12. A transparent display device, comprising the transparent display panel according to claim 1.

13. A method for manufacturing a transparent display panel, comprising:
providing a first display substrate, wherein the first display substrate comprises a first substrate and a plurality of first pixel units arranged on the first substrate, each of the first pixel units comprises a first display unit and a first transparent unit;
providing a second display substrate, wherein the second display substrate comprises a second substrate and a plurality of second pixel units arranged on the second substrate, the plurality of second pixel units are in one-to-one correspondence with the plurality of first pixel units, each second pixel unit comprises a second display unit and a second transparent unit, the plurality of first pixel units first pixel unit and the plurality of second pixel units in one-to-one correspondence with the plurality of first pixel units constitute a plurality of pixel units;
bonding the first display substrate and the second display substrate, so that for each pixel unit, an orthographic projection of the first display unit of the first pixel unit on the second substrate coincides with an orthographic projection of the second display unit of the second pixel unit corresponding to the first pixel unit on the second substrate, and an orthographic projection of the first transparent unit of the first pixel unit on the second substrate coincides with an orthographic projection of the second transparent unit of the second pixel unit corresponding to the first pixel unit on the second substrate,
wherein the first display unit is located on a side of the first substrate facing the second display substrate, and the first display unit is configured to emit light toward the second substrate; the second display unit is located on a side of the second substrate facing the first display substrate, and the second display unit is configured to emit light toward the second substrate.

* * * * *